United States Patent [19]

Avanzino et al.

[11] Patent Number: 4,954,459
[45] Date of Patent: Sep. 4, 1990

[54] METHOD OF PLANARIZATION OF TOPOLOGIES IN INTEGRATED CIRCUIT STRUCTURES

[75] Inventors: Steven C. Avanzino, Cupertino; Jacob D. Haskell, Palo Alto, both of Calif.

[73] Assignee: Advanced Micro Devices, Inc., Sunnyvale, Calif.

[21] Appl. No.: 376,176

[22] Filed: Jul. 3, 1989

Related U.S. Application Data

[63] Continuation-in-part of Ser. No. 193,478, May 12, 1988.

[51] Int. Cl.$^5$ .......................................... H01L 21/465
[52] U.S. Cl. ................................ 437/228; 437/238; 437/235; 148/DIG. 51
[58] Field of Search .................. 437/67, 68, 228, 225, 437/233, 229, 238, 240, 235

[56] References Cited

U.S. PATENT DOCUMENTS

| 4,662,064 | 5/1987 | Hsu | 437/195 |
| 4,789,648 | 12/1988 | Chow | 437/228 |

FOREIGN PATENT DOCUMENTS

| 0023146 | 1/1981 | European Pat. Off. | 148/DIG. 51 |
| 0148988 | 12/1978 | Japan | 437/67 |
| 0030136 | 2/1983 | Japan | 437/67 |
| 0048936 | 3/1983 | Japan | 437/67 |
| 124142 | 7/1984 | Japan | 437/67 |
| 175137 | 10/1984 | Japan | 437/67 |

OTHER PUBLICATIONS

Chen, J. Y. et al, "A Fully Recessed Field Isolation technology Using Photo-CVD Oxide", *IEDM*, vol. 82, 1982, pp. 233-236.

Shibata, T. et al, "A Simplified Box (Buried-Oxide) Isolation technology for Megabit Dynamic Memories", *IEDM*, vol. 83, 1983, pp. 27-30.

*Primary Examiner*—Brian E. Hearn
*Assistant Examiner*—Trung Dang
*Attorney, Agent, or Firm*—John P. Taylor

[57] ABSTRACT

A method is disclosed for making a highly planarized integrated circuit structure having deposited oxide portions planarized to the level of adjacent portions of the integrated circuit structure which comprises: depositing, over an integrated circuit structure having first portions at a height higher than the remainder of the integrated circuit structure, a conformal oxide layer having a thickness which exceeds the height of said first portions above the remainder of the integrated circuit structure; forming a patterned mask layer over said deposited oxide layer with one or more openings therein in registry with the higher height first portions of the integrated circuit structure; etching exposed portions of said conformal oxide layer through the mask openings down to a level approximately equal to the level of the unexposed portion of the conformal oxide layer; removing the mask layer; and polishing the oxide layer to remove raised portions of the conformal oxide layer remaining after the etching step to form a highly planarized structure. Optionally, the oxide layer may be further etched anisotropically until the upper surfaces of the underlying integrated circuit structure is exposed.

21 Claims, 6 Drawing Sheets

METHOD OF PLANARIZATION OF TOPOLOGIES IN INTEGRATED CIRCUIT STRUCTURES

CROSS-REFERENCE TO RELATED APPLICATION

This application is a continuation-in-part of U.S. patent application Ser. No. 193,478, filed May 12, 1988.

BACKGROUND OF THE INVENTION

1. Field of the Invention

This invention relates to the planarizing of integrated circuit structures. More particularly, this invention relates to an improved method for forming highly planarized oxide portions in integrated circuit structures.

2. Description of the Related Art

In the conventional construction of integrated circuit structures, field oxide, for example, is usually grown on and into the surface of the silicon substrate to provide oxide insulation between adjacent active devices by masking the active device regions of the substrate and then oxidizing the remaining portions of the substrate.

In the formation of such oxide regions by oxidation of the silicon substrate, that is, by oxide growth rather than by deposition, the oxide grows down into the substrate as well as extending upwardly from the surface. For example, when growing an oxide layer of about one micron thickness, the oxide growth will extend down into the substrate about half the distance, that is, extend down about 0.5 micron below the original silicon substrate surface and also extend about 0.5 micron above the original silicon substrate surface, due to the fact that a given number of silicon atoms in crystalline silicon occupies less volume than the oxide of the same number of silicon atoms.

While this phenomena changes the vertical topology of the integrated circuit structure somewhat, the greater problem is that this expansion of the oxide volume also occurs laterally as well as vertically. Thus, as shown in the prior art structure shown in FIG. 1, the field oxide grown in the unmasked regions of the substrate also extends partially into the masked regions of the substrate with both the downwardly and upwardly extent of the oxide tapering off the further the oxide extends laterally, thus forming what is known in the industry as a "bird's beak".

This "bird's beak" region then narrows the active region of the substrate in between the field oxide portions in which active devices can be constructed, as shown in FIG. 1, down to a width x with the width of the mask minus x representing the area of lateral encroachment of the grown oxide. To remedy this, the dimensions of the mask must be altered to accommodate this encroachment, i.e., the openings for the field oxide must be made smaller.

This, in turn, becomes a problem as the density of integrated circuit structures increase with VLSI. When the lines and spaces, for example, become less than one micron, problems of lithography occur. Furthermore, there may be yet further encroachment if the field implant, i.e., the doping beneath the field oxide, laterally migrates with the field oxide as it grows, thus reducing the active device region still further.

The problems associated with "growing" field oxide regions in an integrated circuit structure has been recognized and attempts have been made to remedy these problems. For example, Chen et al, in an article entitled "A FULLY RECESSED FIELD ISOLATION TECHNOLOGY USING PHOTO-CVD OXIDE", published in IDEM 82 at pp. 233–236, discuss the use of a photoresist layer to etch a groove which is then filled with a photox-CVD oxide (photox) before removing the photoresist mask. Excess "photox" is then removed with the photoresist by liftoff.

Shibata et al, in an article entitled "A SIMPLIFIED BOX (BURIED-OXIDE) ISOLATION TECHNOLOGY FOR MEGABIT DYNAMIC MEMORIES", published in IDEM 83 at pp 27–30, discuss forming isolation oxide by refilling anisotropically etched recesses in silicon substrates with deposited oxide. The original BOX process used two steps, a plasma $SiO_2$ lift-off in the first step and redeposition of CVD $SiO_2$ followed by planarization etch-back in the second step. The authors noted that this procedure works satisfactorily for recesses narrow in width, but fails to leave field oxide in wide open areas. The authors suggest using two resist layers with the first resist providing a mask over the oxide in the wide open areas and the second resist layer apparently acting as a planarizing layer.

In parent U.S. application Ser. No. 193,478, cross reference to which is hereby made, there is described and claimed a more satisfactory way to form highly planarized field oxide regions between active regions in the substrate while eliminating the formation of the "bird's beak" encroachment experienced with prior art field oxide growth.

The method described and claimed in that application utilized a mechanically polishable planarization layer, such as a polysilicon layer, which is applied over an oxide layer and then polished down to the highest level of the oxide. The exposed oxide is then etched down to a predetermined level above the underlying integrated circuit structure after which the remaining polysilicon is removed by a further polishing step. The oxide may then be etched down to the level of the highest portions of the underlying integrated circuit structure.

The result is a highly planarized field oxide type separation between active regions, such as, for example, either active devices formed in the substrate or between stepped regions in an integrated circuit structure such as those which occur when conductive lines are formed over the substrate, whereby the topology of the resulting structure will minimize formations of such steps or other nonplanar structures, i.e., will result in a highly planarized integrated circuit structure.

While this method has been found to provide highly planarized structures in most instances, the use of a polishing step to planarize the polysilicon layer can result in problems when the underlying oxide portions are very wide, i.e., over 200 microns in width, because the polishing means are usually insufficiently flat to prevent some of the oxide under the polysilicon from being exposed in such wide areas.

SUMMARY OF THE INVENTION

It is, therefore, an object of this invention to provide a process for producing highly planarized oxide portions in an integrated circuit structure, without utilizing a planarizing layer of polysilicon nor a planarizing step where two different materials are exposed to the planarizing means, using a conformal layer of deposited oxide which is planarized to a predetermined level with respect to adjacent portions of the integrated circuit structure by depositing a layer of conformal oxide over the integrated circuit structure, applying a patterned mask layer over the oxide layer with openings in registry with raised portions of the oxide layer, etching the raised oxide portions down to approximately the same height as the low portions of the oxide layer, removing the mask layer, and then polishing the remaining portions of the oxide layer to obtain a highly planarized layer.

It is another object of the invention to provide a highly planarized field oxide for an integrated circuit structure which is deposited in shallow openings provided in the underlying silicon substrate between active regions in said substrate by first forming such shallow openings in the substrate; depositing a layer of oxide which is thicker than the depth of the shallow openings to form a conformal layer of oxide over the structure, forming a mask layer over the deposited oxide layer having openings corresponding to the raised portions of the underlying conformal oxide layer, etching the exposed oxide through the mask layer down to a level approximately equal to the height of the lowest portion of the unexposed area of the oxide layer, removing the mask layer to exposed the remaining portions of the oxide layer, mechanically polishing the oxide layer to remove any remaining raised portions of the oxide layer, and then optionally etching the remaining oxide layer down to the level of the top surface of the active regions of the substrate to thereby form a highly planarized structure comprising oxide portions in the substrate which are level with the substrate level in the active region of the substrate.

It is a further object of the invention to provide a highly planarized integrated circuit structure comprising a raised or stepped pattern interleaved with oxide portions formed by depositing an oxide layer over an integrated circuit structure containing such a raised pattern, the oxide layer deposited to a thickness greater than the thickness of the raised pattern, to form a conformal layer of oxide over the structure, forming a mask layer over the deposited oxide layer with openings conforming to the raised or stepped pattern beneath the conformal oxide layer, etching the exposed oxide down to a level approximately equal to the height of the lowest portion of the unexposed area of the oxide layer, removing the mask layer to expose the unetched portions of the oxide layer, and then mechanically polishing the oxide layer to remove any remaining raised portions of the oxide layer to result in a highly planarized top surface. Optionally the remaining oxide layer may be etched down to the level of the top surface of the raised pattern to thereby form a highly planarized structure with oxide in the spaces between the exposed raised pattern.

These and other objects of the invention will be apparent from the following description and accompanying drawings.

DETAILED DESCRIPTION OF THE INVENTION

The invention provides an improved method for forming highly planarized topologies in integrated circuit structures wherein oxide is used between active or conductive regions formed in or on an integrated circuit structure. In the illustrated embodiments, the process of the invention is shown, by way of illustration and not of limitation, as applied either to the formation of a highly planarized integrated circuit structure having field oxide deposited between active regions in a silicon substrate; or in forming a highly planarized structure with a raised pattern such as, but not limited to, metal lines formed over an integrated circuit structure previously formed in and on a substrate, with oxide upon and/or between the raised pattern.

Figure 1:
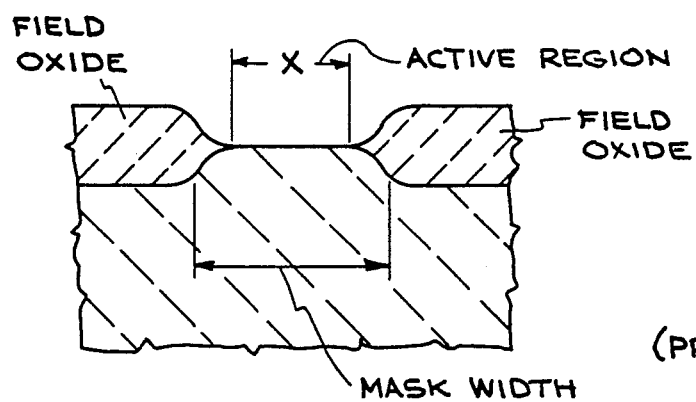
FIG. 1 is a fragmentary vertical cross-section of a prior art structure showing the formation of a "bird's beak" by growth of field oxide regions in a silicon substrate which encroach into the active device region of the substrate.
Figure 2:
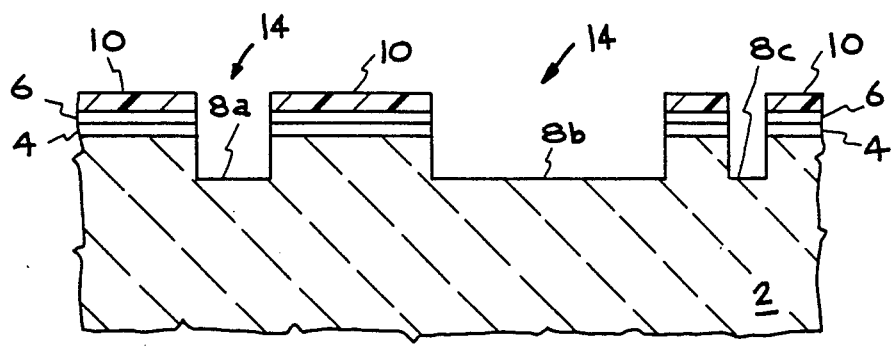
FIG. 2 is a fragmentary vertical cross-section showing an early stage of a first embodiment of the invention wherein a silicon substrate has been masked to cover active regions of the substrate and openings have been etched in the silicon substrate through the mask openings.

Referring now to FIG. 2, a silicon substrate 2 is shown with a photoresist mask 10 thereon over active regions to be formed in the substrate and having openings 14 in mask 10 conforming to desired field oxide regions to be formed in silicon substrate 2. As shown in FIG. 2, openings or slots 8a, 8b, and 8c have already been etched in silicon substrate 2 through mask openings 14 to a depth of, for example, from about 0.45 to about 0.55 microns.

Before forming mask 10 over substrate 2, an oxide layer 4 may be grown on the surface of substrate 2 to a thickness of, for example, 300–500 Angstroms, as shown in FIG. 2, followed by deposition of about 1000 to about 2000 Angstroms, preferably about 1300 to about 1500 Angstroms, of silicon nitride 6 which may form an optional etch block for a subsequent etching step as will be described below. Since oxide layer 4 is used merely as an underlying layer for the optional nitride etch block layer, elimination of nitride layer 6 can also result in elimination of oxide layer 4 as well, if desired. Alternatively, if desired, oxide layer 4 may be used beneath resist mask 10 even when nitride layer 6 is omitted.

Openings 8a–8c are etched in silicon substrate 2, in one embodiment, as shown in FIG. 2, by an anisotropic etch, such as a reactive ion etch (RIE) process, to form substantially orthogonal sidewalls, that is, sidewalls normal to both the plane of the substrate surface prior to the etch and normal to the bottom of openings 8a–8c.

Figure 2A:
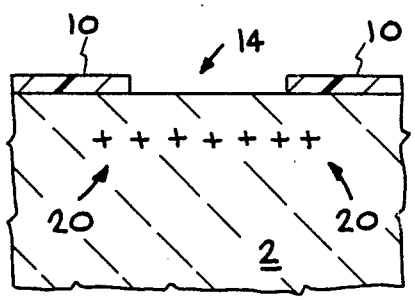
FIG. 2A is a fragmentary vertical cross-section of an alternate step in the process to produce the structure of FIG. 2 showing an optional field implant before forming the openings for the field oxide.
Figure 2B:
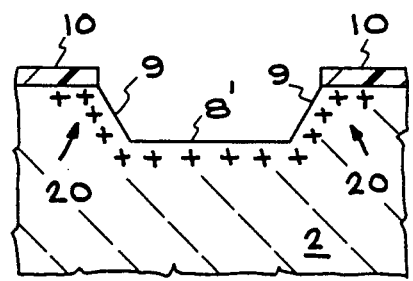
FIG. 2B is a fragmentary vertical cross-section of an alternate embodiment of the structure of FIG. 2 showing a tapered sidewall opening which facilitates the illustrated use of a field implant after forming openings for the field oxide.

In a variation of this embodiment, where it is desired to perform a field implant beneath the field oxide region to be formed in openings 8a, 8b, and/or 8c etched in substrate 2, for example, when forming an n-channel device where undesirable inversion in the substrate can occur, the substrate may be implanted prior to forming the field oxide, as shown in FIGS. 2A and 2B.

As shown in FIG. 2A, a first implantation and diffusion doping of substrate 2 may be carried out prior to any etching step through openings 14 in mask 10. By conducting this doping step prior to the etching step, some of the dopant will laterally scatter and diffuse into the edge of the adjacent active device region of the substrate as shown at 20, representing a crucial area where voltage inversion should be avoided. This doping step, for example, may be carried out by implanting boron followed by diffusion at between about 800° and 900° C for at least 15 minutes to result in a final boron concentration high enough to prevent field inversion, typically $10^{16}$ cm$^{-3}$.

Alternatively, as shown in FIG. 2B, after the etching of opening 8' (which may be carried out to the same depth as openings 8a–8c), a second doping step may be carried out to dope the newly exposed substrate surfaces over or against which the field oxide will be deposited. As shown in FIG. 2B, advantageously sidewall 9 of substrate opening 8' will be formed with a slope by adjusting the anisotropic etch slightly to form sidewalls with an inward slope of about 3–5 degrees to facilitate the subsequent doping of sidewalls 9 of opening 8'. The bottom and sidewalls of substrate 2 exposed by opening 8' may then be doped with boron to a concentration sufficient to prevent field inversion, typically $10^{16}$ cm$^{-3}$.

Figure 2C:
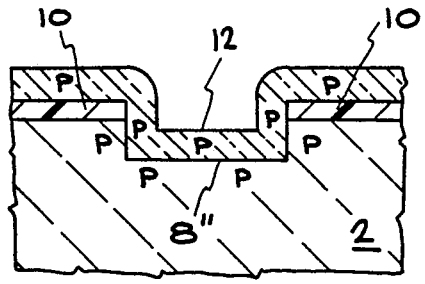
FIG. 2C is a fragmentary vertical cross-section of yet another embodiment wherein the doping of the vertical sidewalls of n-channel regions to form channel stops is accomplished by initially conformally depositing a thin film of doped glass and subsequently diffusing dopant into the vertical sidewalls.

In yet another embodiment, as shown in FIG. 2C, the sidewalls and bottom walls of opening 8'', which may represent any or all of the openings 8a–8c, may be doped subsequent to formation of the opening, even with a vertical sidewall, by depositing a thin layer of doped glass 12 such as a borosilicate glass into the opening and then allowing the dopant in the glass to diffuse into the sidewalls and bottom of the opening. The doped glass is then removed from opening 8'' prior to further processing to planarize the structure. It should be noted that since it is only desired to form channel blocks in the substrate adjacent the n-channel, other areas of the substrate, including p-channel areas, would be masked by thermally grown silicon dioxide during such doped glass deposition and subsequent removal steps. However, a phosphorus glass may also be employed to block the p channel areas by a similar method.

Figure 3:
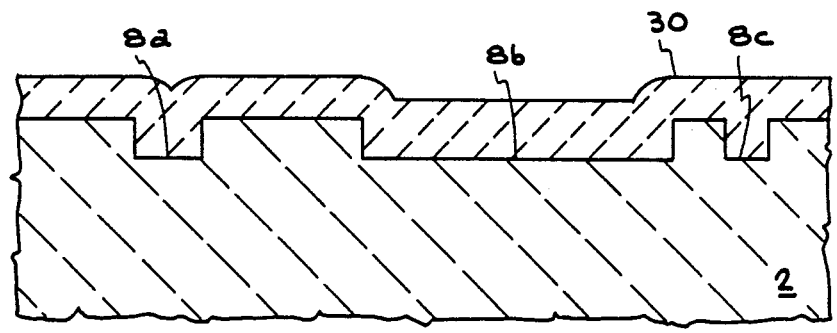
FIG. 3 is a fragmentary vertical cross-section showing the structure shown in FIG. 2 at a later stage of the process with at least the top layer of the mask removed and a conformal oxide layer deposited over the substrate and in the etched away openings in the substrate.

After forming openings 8a–8c (or 8' or 8''), photoresist mask layer 10 is removed and, as shown in FIG. 3, a conformal layer of oxide 30 is deposited over the entire structure to a thickness sufficiently in excess of the depth of openings 8a–8c so that the level of oxide in the lowest point in the widest opening 8b is above the highest point in the adjoining active regions of the substrate, including any etch stop layers, such as oxide 4 or nitride 6, which may still be optionally present thereon, as shown in FIG. 2.

It will be noted that the height of oxide layer 30 over wide opening 8b is not as high as over narrower etched openings 8a and 8c. As previously discussed with respect to the prior art, when wide openings are etched and then filled with oxide to form a field oxide region, oxide layer 30 tends to conform to the underlying topography. Since the eventual structure, in accordance with the invention, will be highly planarized, it is important to the practice of the present invention that the thickness of oxide layer 30 over wide opening 8b exceed the depth of opening 8b from the unetched surface of the substrate. This is illustrated in the enlarged region of FIG. 3 shown in FIG. 4 wherein the depth of etched opening 8b from the surface is represented by $X_1$ while the thickness of oxide layer 30 over opening 8b is represented by $X_2$.

In accordance with the invention, the thickness of oxide layer 30 over wide opening 8b($X_2$) must be greater than the depth $X_1$ of opening 8b. The difference between $X_1$ and $X_2$ is preferably from about a minimum of about 0.15 microns up to about 0.45 microns. Greater thicknesses of oxide may be used, if desired, but are unnecessary. Thus, for example, when the depth of opening 8b is about 0.5 microns, the thickness of oxide layer 30 over opening 8b will range from about 0.65 up to 0.95 microns.

Preferably, the deposited oxide is a highly conformal oxide, such as, for example, tetraethyl orthosilicate (TEOS), which is deposited at a temperature of from about 700° to about 750° C. Alternatively, the deposited oxide may comprise a low pressure chemical vapor deposition (CVD) oxide layer deposited at a temperature of from about 350° to about 450° C.

Figure 5:
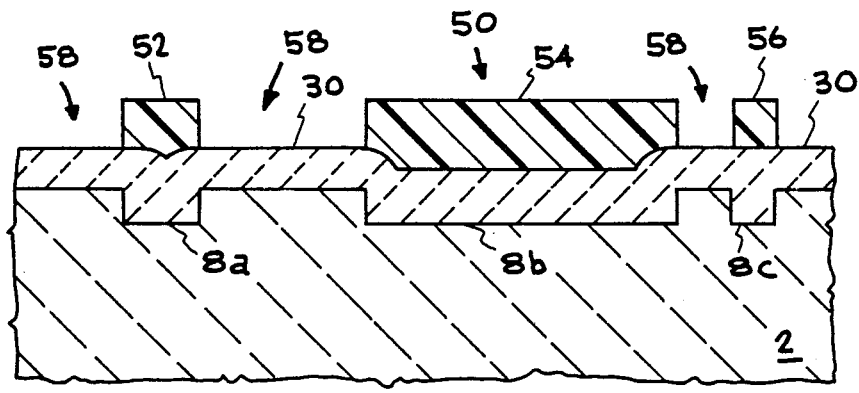
FIG. 5 is a fragmentary vertical cross-section of the structure of FIG. 3 after a mask layer has been formed over the conformal oxide layer.

As shown in FIG. 5, a second mask layer generally indicated at 50, comprising mask portions 52-56, and openings 58 which are in registry with the portions of substrate 2 in between openings 8a-8c, is then formed over conformal oxide layer 30. Mask layer 50 preferably comprises a photoresist mask, but may comprise any material compatible with the underlying conformal oxide layer and capable of withstanding a subsequent oxide etch. By way of illustration and not of limitation, masking layer 50 will be described hereinafter as a photoresist mask.

Photoresist mask layer 50 may be patterned using a photolithography mask which is the reverse of the mask used to pattern photoresist layer 10. Alternatively, the same photolithography mask could be used with photoresist layer 50 of opposite sensitivity to that of photoresist layer 10, e.g., positive photoresist used for layer 10 and negative photoresist used for layer 50, or by using an image reversal photolithography technique.

Figure 6:
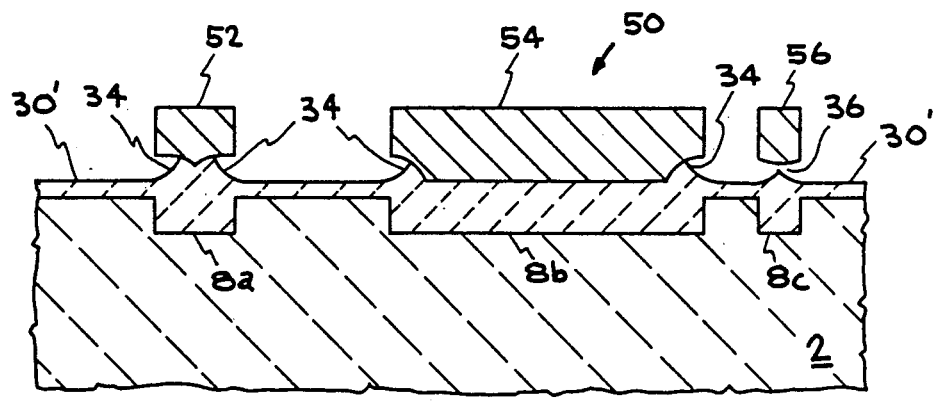
FIG. 6 is a fragmentary vertical cross-section showing the structure of FIG. 5 after etching of exposed portions of the conformal oxide layer through the mask layer down to a level approximately even with the level of the unexposed portions of the conformal oxide layer (level $X_2$ in FIG. 4).

In accordance with the invention, as shown in FIG. 6, the exposed portions of conformal oxide layer 30 are now etched down to the level of the unexposed portions of oxide layer 30, i.e., down to about the level $X_2$, preferably using a wet etch such as, for example, a buffered oxide etch comprising an aqueous solution of 40 parts ammonium fluoride ($NH_4F$) and 1 part hydrofluoric acid (HF).

A dry etchant system, such as, for example, a reactive ion etch (RIE), using $CHF_3$ chemistry with the oxygen level adjusted to favor oxide removal, could also be used to etch conformal oxide layer 30. However, an isotropic type etch such as a wet etch which will undercut photoresist mask portions 52-56, as shown at 34 and 36 in FIG. 6, is preferred since there will be less oxide remaining in the raised portions adjacent the edges of the photoresist mask, which will, in turn, simplify subsequent removal of such raised portions as will be described below.

It will be noted, in this regard, that this undercutting by the isotropic etching will, in some cases, completely undercut the photoresist mask, as shown at 36 in FIG. 6, where mask portion 56 has been completely undercut. Since the next step is removal of mask 50, such complete undercutting of portions of mask 50 is not harmful.

Figure 7:
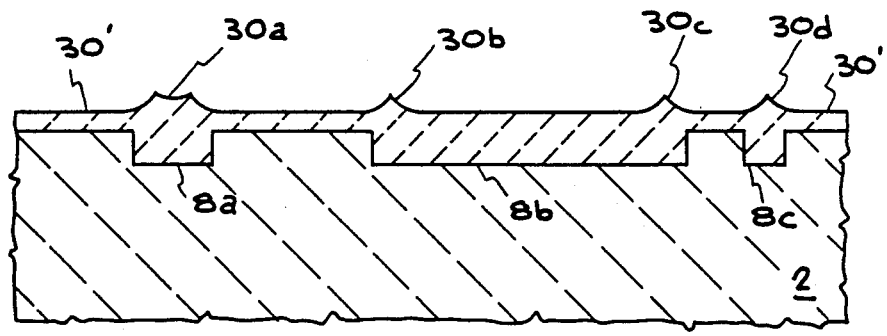
FIG. 7 is a fragmentary vertical cross-section showing the structure of FIG. 6 after removal of the mask layer.

After completion of the etching step, photoresist mask 50 is removed, for example, using a hot solution of concentrated (18 molar) sulfuric acid and hydrogen peroxide, leaving the structure shown in FIG. 7 with remaining conformal oxide layer 30' shown with raised portions 30a-30d remaining from the etching step.

The structure is now polished using either a mechanical polishing means or, preferably, a chemical/mechanical polishing means, to remove raised oxide portions 30a-30d remaining on the surface of the remaining portion 30' of conformal oxide layer 30.

The abrasive means used in the polishing step may comprise a purely mechanical polish using, for example, as a polishing material an aqueous slurry of finely divided $Al_2O_3$ or $SiO_2$ particles, with the pH adjusted to about 7, spread on a flat polymeric disk. Alternatively, for a chemical/mechanical polish, the polishing material may also include a minor amount of a hydroxide such as KOH or NaOH added in a sufficient amount to increase the pH to about 9-11, or, preferably, the polishing material may include HCl to adjust the pH to about 2 to provide the desired chemical/mechanical polish.

Figure 4:
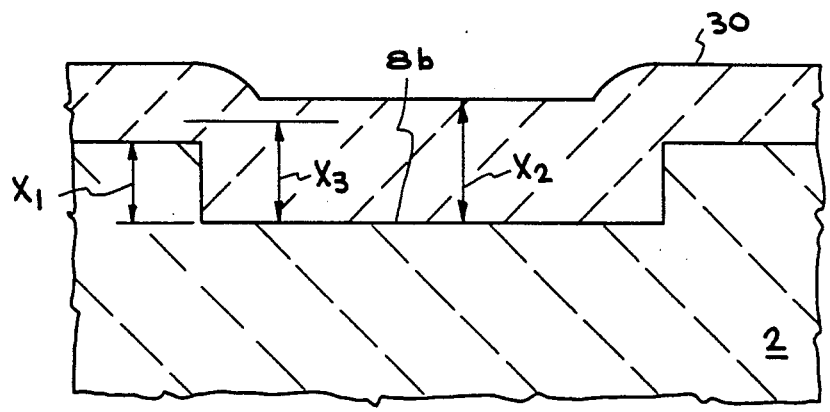
FIG. 4 is an enlarged fragmentary vertical cross-section of a portion of the structure of FIG. 3 showing the difference between the depth $X_1$ of the etched area and the minimum thickness $X_2$ of the conformal oxide layer deposited over the structure, with $X_3$ representing an intermediate level between $X_1$ and $X_2$.
Figure 8:
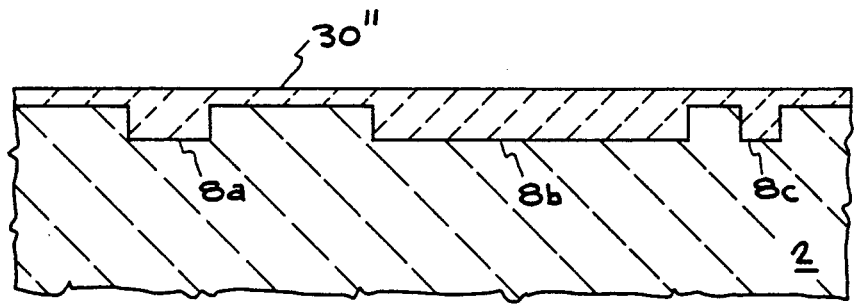
FIG. 8 is a fragmentary vertical cross-section showing the structure of FIG. 7 after a chemical/mechanical polishing step to remove any remaining raised portions of the conformal oxide layer leaving a highly planarized structure.

This polishing step is carried out until the high oxide portions 30a-30d of underlying conformal oxide layer 30' are removed, leaving a highly planarized surface 30'', as shown in FIG. 8 which may be about the level $X_3$ shown in FIG. 4, i.e., slightly below the original level $X_2$ representing the lowest original height of conformal oxide layer 30, but above the underlying integrated circuit structure.

Since the result of this polishing step, as shown in FIG. 8, is a highly planarized conformal oxide layer 30'', it may be desirable to end the planarizing portion of the process at this point, for example, if further processing of the underlying silicon structure is not necessary or desired. In such cases, for example, vias may be cut through planarized oxide layer 30'' to provide contact to appropriate portions of the underlying silicon substrate where desired.

If the planarizing portion of the process is to be terminated at this stage, it should be pointed out that nitride layer 6 would preferably be removed at an earlier stage of the process prior to deposition of conformal oxide layer 30.

Figure 9:
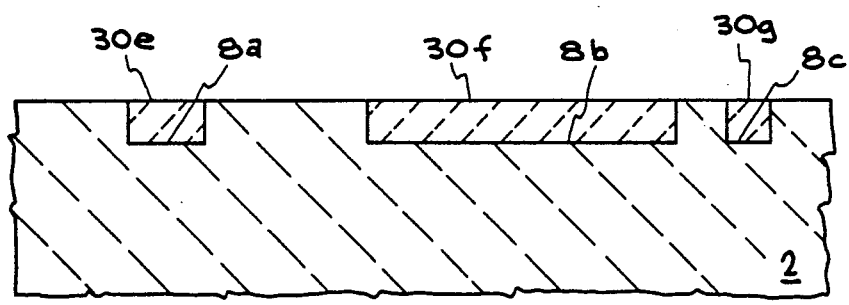
FIG. 9 is a fragmentary vertical cross-section showing the planarized structure of FIG. 8 after performing an optional final etching step of this embodiment with further conformal oxide removed by a second etch until the top surface of the active regions of the integrated circuit structure are exposed.

Alternatively, oxide layer 30'' may be further etched to expose the adjoining active regions of the substrate, leaving oxide portions 30e-30g remaining in between the exposed portions of substrate 2, as shown in FIG. 9. In such instance, the presence of nitride mask portions 6 may be desirable to provide a convenient etch stop to prevent inadvertent etching of silicon substrate 2. This etch step is preferably an anisotropic etch carried out using the RIE etching method described previously, although wet etching may be used if one can control the selectivity of wet etching to etch the seams formed during the initial oxide deposition.

Whether the planarizing process is completed with the structure shown in FIG. 8 or with the structure shown in FIG. 9, preferably the remaining oxide is then densified, by heating the structure to a temperature of about 800°-900° C, preferably about 900° C, in an oxidizing atmosphere for about 30 minutes.

Figure 10:
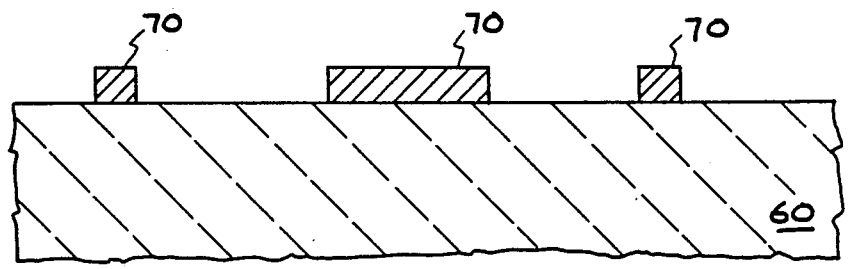
FIG. 10 is a fragmentary vertical cross-section of another embodiment of the invention wherein a raised pattern is formed over an integrated circuit structure.

Turning now to FIGS. 10-16, another embodiment of the process of the invention is shown commencing with FIG. 10 wherein an integrated circuit structure 60, which may include previously formed active devices in or on the surface of a substrate, such as a silicon substrate, is shown provided with a raised pattern 70 over the substrate surface.

Patterned layer 70 might, for example, comprise a 3000 to 10,000 Angstrom layer of a conductor, e.g., metal patterned to form metal lines or interconnects. When layer 70 comprises a conductor, it may comprise any conductor conventionally used in forming integrated circuit structures, such as, for example, aluminum, polysilicon, or tungsten, capable of withstanding the temperatures subsequently used in depositing the conformal and planarizing layers thereon.

Raised pattern 70 might also comprise the combination of a raised pattern of conductors and an insulating layer formed over the conductors, or it might only comprise an insulating material. Patterned layer 70, however, will be described below, by way of illustration, and not of limitation, as a metal pattern.

Figure 11:
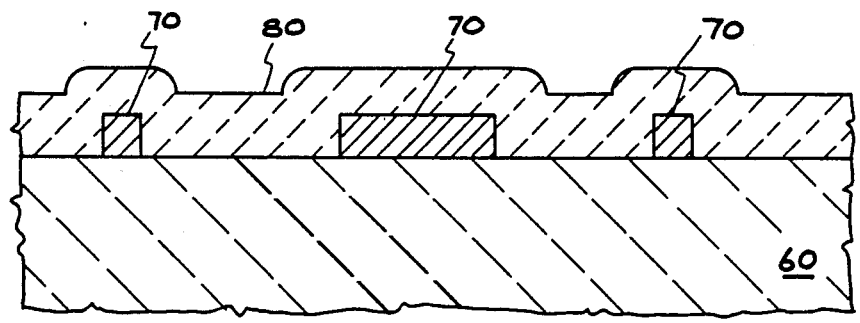
FIG. 11 is a fragmentary vertical cross-section showing the structure of FIG. 10 with a conformal layer of oxide deposited over the raised pattern.

As shown in FIG. 11, a conformal layer of oxide 80 is deposited over structure 60 and metal pattern 70 to a thickness which, in the widest area between metal lines, will again be a thickness $X_2$, as in the first embodiment, which is greater than $X_1$, the thickness of the metal pattern 70. Usually, the thickness $X_2$ will be greater than the thickness $X_1$ by about 0.2 microns up to about 1.2 microns. The thickness of conformal oxide layer may vary, for example, from about 7000 to about 15,000 Angstroms.

Conformal oxide layer 80 may comprise an oxide material such as the previously described TeOS oxide, which may be used over materials which can withstand temperatures above 700° C, up to 750° C. It should be noted here, that if a lower melting metal such as aluminum is used for metal pattern 70, then a lower deposition temperature TeOS oxide, e.g., one deposited at about 350° C, such as plasma TeOS, may be substituted for the previously described conformal oxide, or a lower temperature CVD oxide (e.g., deposited at about 350° C) may be used.

Figure 12:
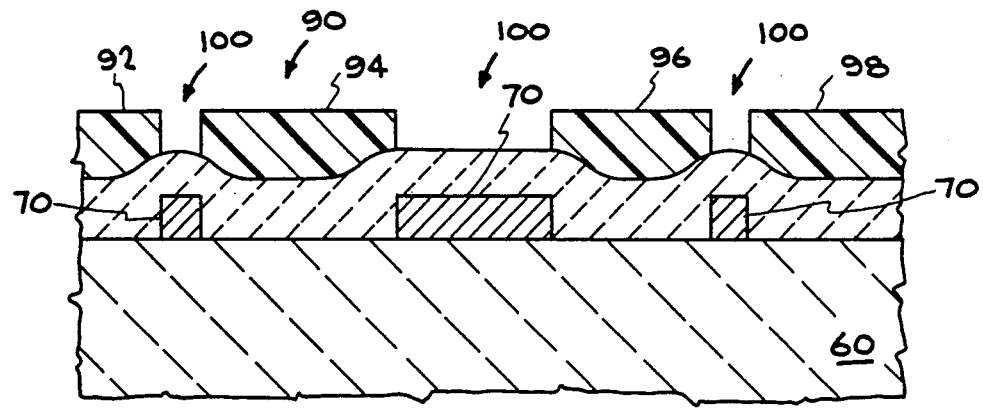
FIG. 12 is a fragmentary vertical cross-section showing a further step of this embodiment with a mask layer formed over the conformal layer shown in FIG. 11.

As in the first embodiment, a layer of masking material 90 such as, for example, a photoresist mask is now formed over the structure as shown in FIG. 12 with openings 100 provided between mask portions 92-98. Mask openings 100 are formed in registry with the raised pattern portions 70 beneath conformal oxide layer 80.

Figure 13:
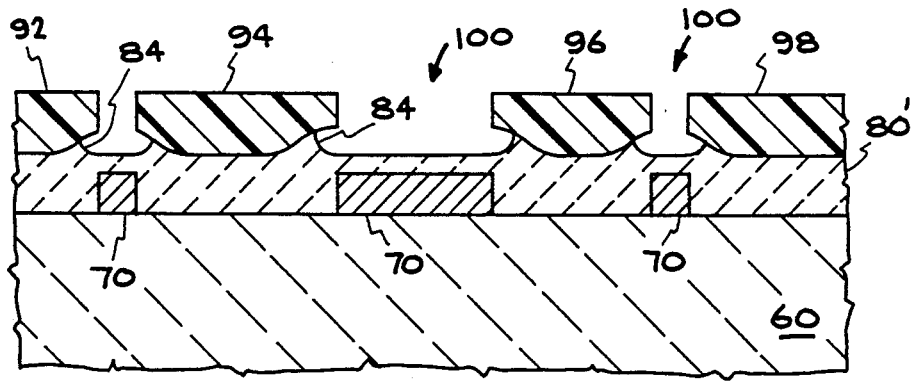
FIG. 13 is a fragmentary vertical cross-section showing etching of the exposed portions of the conformal oxide layer through the mask down to the level of the unexposed portions of the conformal oxide layer.

In accordance with the invention, as shown in FIG. 13, the exposed portions of conformal oxide layer 80 are now etched down to the level of the unexposed portions of oxide layer 80, as described in the previous embodiment, again preferably using an isotropic wet etch such as the previously described buffered oxide etch solution to not only remove the exposed portions of oxide 80 but to undercut mask portions 92-98, as shown at 84.

Figure 14:
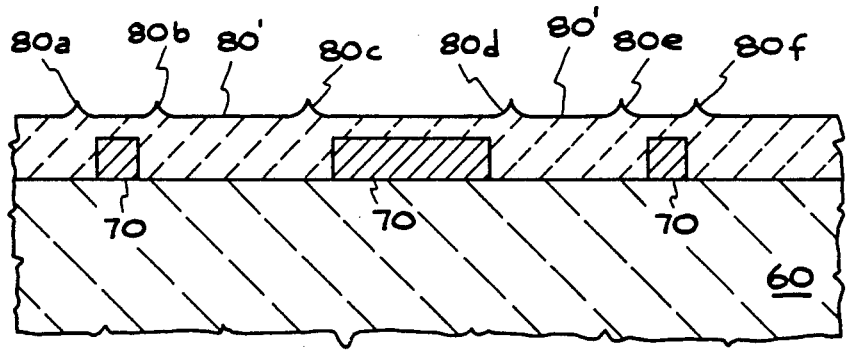
FIG. 14 is a fragmentary vertical cross-section showing the structure of FIG. 13 after removal of the mask layer.

After completion of the etching step, photoresist mask 90 is removed, as in the previous embodiment, leaving the structure shown in FIG. 14 with remaining conformal oxide layer 80' shown with raised portions 80a-80f resulting from the etching step.

Figure 15:
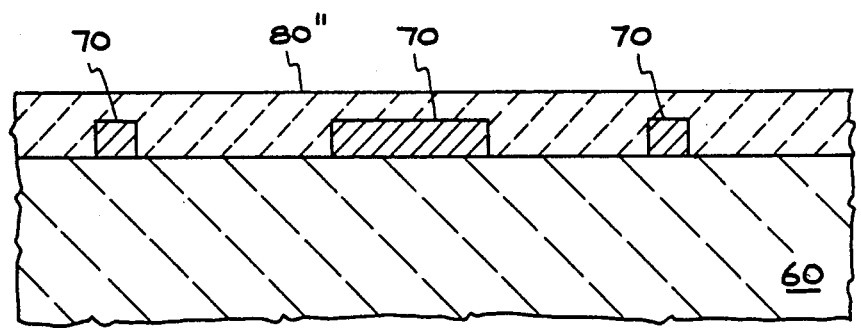
FIG. 15 is a fragmentary vertical cross-section showing the structure of FIG. 14 after a chemical/mechanical polishing step to remove any remaining raised portions of the conformal oxide layer leaving a highly planarized structure.

The structure is now polished using either a mechanical polishing means or, preferably, a chemical/mechanical polishing means, as described with respect to the previous embodiment, to remove raised oxide portions 80a-80f remaining on the surface of the remaining portion 80' of original conformal oxide layer 80, resulting in the planarized structure of FIG. 15.

Figure 16:
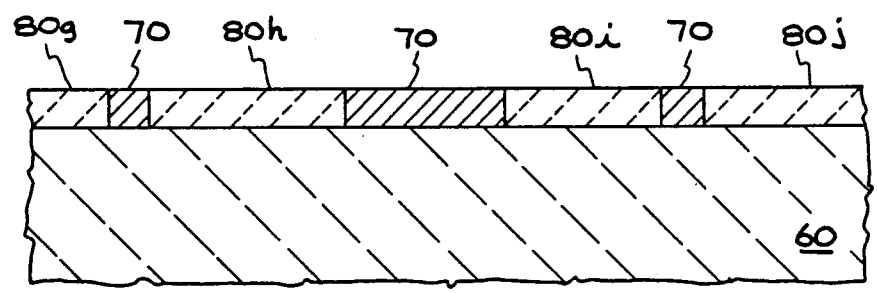
FIG. 16 is a fragmentary vertical cross-section showing a further, but optional, etching step performed on the planarized structure of FIG. 15 to remove sufficient additional conformal oxide to expose the top surface of the raised pattern thereunder.

As previously discussed with respect to the embodiment shown in FIG. 8, the planarizing portion of the process may be stopped here and the remaining conformal oxide layer 80" may be densified as previously described, or the structure may be further etched, preferably using the anisotropic dry etching previously described, to produce the structure shown in FIG. 16 in which the top of the raised pattern portions 70 are exposed, leaving planarized oxide portions 80g-80j therebetween.

Thus, the invention provides an improved method for forming highly planarized topology in integrated circuit structures which may be used in forming highly planarized oxide regions adjacent active device regions in a substrate or a highly planarized structure of a raised pattern such as metal lines interleaved with oxide by utilizing a conformal oxide layer which is selectively etched through openings in a mask thereon in registry with the raised portions of the underlying structure and then, after removal of the mask, polished to remove any remaining raised portions of the conformal oxide, leaving a highly planarized surface.

Having thus described the invention, what is claimed is:

1. A method of making a highly planarized integrated circuit structure having highly planarized oxide portions, without utilizing a planarizing layer of polysilicon nor a planarizing step where two different materials are simultaneously removed by the planarizing means, using a conformal layer of deposited oxide which is planarized to a predetermined level with respect to adjacent portions of the integrated circuit structure which comprises:
   (a) depositing said conformal oxide layer over said integrated circuit structure;
   (b) applying a patterned mask layer over said oxide layer with openings in registry with raised portions of said oxide layer;
   (c) etching said raised oxide portions down to approximately the same height as low portions of said oxide layer;
   (d) removing said mask layer; and
   (e) polishing the remaining portions of said oxide layer to obtain a highly planarized layer.

2. A method of making a highly planarized integrated circuit structure having highly planarized oxide portions using deposited oxide which is planarized to a level adjacent portions of the integrated circuit structure which comprises:
   (a) depositing over an integrated circuit structure having first portions at a height higher than the remainder of said integrated circuit structure, a conformal oxide layer having a thickness which exceeds the height of said first portions above the remainder of said integrated circuit structure;
   (b) forming a patterned mask layer over said deposited oxide layer with openings therein in registry with said higher height first portions of said integrated circuit structure;
   (c) etching exposed portions of said conformal oxide layer through said mask openings down to a level approximately equal to the level of the unexposed portion of said conformal oxide layer;
   (d) removing said mask layer; and
   (e) polishing said oxide layer to remove raised portions of said conformal oxide layer remaining after said etching step to form a highly planarized structure.

3. The method of claim 2 wherein said step of depositing said conformal oxide layer is carried out at a temperature of from about 700° to about 750° C.

4. The method of claim 2 wherein said step of depositing said conformal oxide layer further comprises depositing from about 7000 to about 15,000 Angstroms of conformal oxide over said integrated circuit structure.

5. The method of claim 2 wherein said step of depositing said masking layer comprises depositing a patterned layer of photoresist over said conformal oxide layer.

6. The method of claim 5 wherein said step of etching said conformal oxide layer further comprises isotropically etching said conformal oxide layer to undercut adjacent portions of said mask later thereon.

7. The method of claim 6 wherein said step of isotropically etching said conformal oxide layer further comprises wet etching said conformal oxide layer.

8. The method of claim 2 including the further step of etching said polished conformal oxide layer until portions of said underlying integrated circuit structure are exposed.

9. The process of claim 8 wherein said step of etching said polished conformal oxide layer further comprises an anisotropic etching of said conformal oxide.

10. The process of claim 9 including the step of forming a nitride mask over said first portions of said integrated circuit structure having a height higher than the remainder of said integrated circuit structure, whereby said nitride mask will act as an etch stop for said anisotropic etching of said polished conformal oxide layer to prevent etching of the underlying integrated circuit structure.

11. The process of claim 10 including the further step of removing said nitride mask layer after said step of anisotropically etching said polished conformal oxide layer.

12. The method of claim 9 further comprising the additional steps of initially masking active regions of said integrated circuit structure, etching the exposed portions of said integrated circuit structure through said mask to form one or more openings having a depth of from about 0.45 to about 0.55 microns, and removing the mask; whereby said subsequent step of depositing a conformal oxide layer comprises depositing said conformal oxide in said etched openings and over said unetched active regions of said integrated circuit structure to a thickness which exceeds the depth of said etched openings whereby said subsequent planarization steps form a planarized integrated circuit structure having field oxide regions therein with the top surface of said field oxide regions at the same level as the top surfaces of said active regions.

13. The method of claim 12 including the further steps of initially forming an oxide layer over said integrated circuit structure and forming a nitride layer over said oxide layer prior to said step of masking said active regions of said substrate; and said step of etching said integrated circuit structure through said mask further includes etching said nitride and oxide layers formed beneath said mask.

14. The method of claim 2 including the further step of forming a raised pattern over said integrated circuit substrate and wherein said step of depositing said conformal oxide layer further comprises depositing said conformal oxide to a depth which exceeds the height of said raised pattern above said integrated circuit structure.

15. The method of claim 14 including the further step of etching said polished conformal oxide layer until said raised pattern is exposed with the top surface of said conformal oxide portions between said raised pattern at the same level as the top surfaces of said raised pattern.

16. The method of claim 15 wherein said step of forming a raised pattern further comprises forming a pattern of conductive material capable of withstanding the temperatures used in said step of depositing said conformal oxide layer.

17. A method of making a highly planarized integrated circuit structure having field oxide regions formed therein between active regions of a substrate, and at the same level as the active regions, which comprises:

(a) patterning a silicon substrate with a first photoresist mask having openings therein conforming to desired formation of field oxide regions in said substrate between said active regions;

(b) etching said silicon substrate through said photoresist mask to form openings in said substrate having a depth of from about 0.45 microns to about 0.55 microns;

(c) removing said first photoresist mask;

(d) depositing from about 7000 to about 9000 Angstroms of a conformal oxide layer over said substrate;

(e) forming a second photoresist mask over said conformal oxide layer, said mask having openings therein in registry with the portions of said substrate between said openings etched in said substrate;

(f) isotropically etching said conformal oxide layer through said second mask to a level substantially equal to the level of the masked portions of said conformal oxide layer;

(g) removing said second photoresist mask;

(h) polishing said conformal oxide layer to remove raised portions of said conformal oxide layer; and (i) anisotropically etching said conformal oxide layer to expose said active regions of said substrate to form a highly planarized structure having field oxide regions formed therein between said active regions in said substrate with the upper surface of said field oxide regions substantially level with the surface of said active regions.

18. The method of claim 17 wherein including the further step of forming a nitride layer on said substrate prior to patterning said substrate with said first photoresist mask; said step of patterning said substrate further includes patterning said nitride layer; and said patterned nitride layer functions as an etch block during said anisotropic etching step to protect said substrate from said anisotropic etch.

19. A method of making a highly planarized integrated circuit structure having a raised pattern thereon, which comprises:

(a) forming a raised pattern on an integrated circuit structure;

(b) depositing, at a temperature which will not damage said raised pattern, a conformal oxide layer over said raised pattern having a thickness sufficient, at its lowest point, to exceed the height of said raised pattern;

(c) forming a patterned mask layer over said conformal oxide layer, said mask having openings therein in registry with said raised pattern on said substrate;

(d) isotropically etching said conformal oxide layer through said mask to a level substantially equal to the level of the masked portions of said conformal oxide layer;

(e) removing said second mask;

(f) polishing said conformal oxide layer to remove raised portions of said conformal oxide layer; and (g) anisotropically etching said conformal oxide layer to expose the upper surface of said raised pattern on said substrate to form a highly planarized structure having oxide regions formed therein between said raised pattern portions of said substrate with the upper surface of said oxide regions substantially level with the upper surface of said raised pattern.

20. The method of claim 19 wherein said step of forming a raised pattern on an integrated circuit structure includes the step of forming a conductive pattern on said structure.

21. The method of claim 20 wherein said step of forming a conductive pattern further comprises forming a metal pattern on said structure.

* * * * *

UNITED STATES PATENT AND TRADEMARK OFFICE
CERTIFICATE OF CORRECTION

PATENT NO. : 4,954,459

DATED : September 4, 1990

INVENTOR(S) : Steven C. Avanzino and Jacob D. Haskell

It is certified that error appears in the above-identified patent and that said Letters Patent is hereby corrected as shown below:

On the cover page of the patent, the inventorship should read:

Steven C. Avanzino, Cupertino; Jacob D. Haskell, Palo Alto; Subhash Gupta, San Jose, all of Calif.

Signed and Sealed this

Tenth Day of September, 1991

Attest:

*Attesting Officer*

HARRY F. MANBECK, JR.

*Commissioner of Patents and Trademarks*